(12) United States Patent
Cheng et al.

(10) Patent No.: US 10,516,040 B2
(45) Date of Patent: Dec. 24, 2019

(54) METHOD OF FORMING EPITAXIAL SILICON LAYER AND SEMICONDUCTOR DEVICE THEREOF

(71) Applicant: TAIWAN SEMICONDUCTOR MANUFACTURING COMPANY LTD., Hsinchu (TW)

(72) Inventors: Yu-Hung Cheng, Tainan (TW); Po-Jung Chiang, Taoyuan (TW); Yen-Hsiu Chen, Tainan (TW); Yeur-Luen Tu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/961,167

(22) Filed: Apr. 24, 2018

(65) Prior Publication Data
US 2019/0131439 A1     May 2, 2019

Related U.S. Application Data

(60) Provisional application No. 62/579,445, filed on Oct. 31, 2017.

(51) Int. Cl.
*H01L 21/00*     (2006.01)
*H01L 29/739*     (2006.01)
(Continued)

(52) U.S. Cl.
CPC ........ *H01L 29/739* (2013.01); *H01L 21/0245* (2013.01); *H01L 21/0262* (2013.01); *H01L 21/02532* (2013.01); *H01L 21/02609* (2013.01); *H01L 21/02636* (2013.01); *H01L 21/02639* (2013.01); *H01L 21/28518* (2013.01); *H01L 21/3065* (2013.01); *H01L 21/76895* (2013.01); *H01L 29/0649* (2013.01); *H01L 29/0813* (2013.01); *H01L 29/0821* (2013.01); *H01L 29/1004* (2013.01); *H01L 29/66272* (2013.01);
(Continued)

(58) Field of Classification Search
None
See application file for complete search history.

(56) References Cited

U.S. PATENT DOCUMENTS

| | | | |
|---|---|---|---|
| 2009/0023258 A1* | 1/2009 | Liang | H01L 21/823814 438/222 |
| 2014/0134818 A1* | 5/2014 | Cheng | H01L 29/66636 438/300 |

* cited by examiner

*Primary Examiner* — Reema Patel
(74) *Attorney, Agent, or Firm* — WPAT, P.C., Intellectual Property Attorneys; Anthony King

(57) ABSTRACT

A method of manufacturing a semiconductor device includes: providing a substrate including a first semiconductive region of a first conductive type and gate structures over the first semiconductive region, where a gap between the gate structures exposes a portion of the first semiconductive region; and forming a second semiconductive region of a second conductive type in the gap starting from the exposed portion of the first semiconductive region. The forming of the second semiconductive region includes: growing, in a chamber, an epitaxial silicon-rich layer with a first growth rate around a sidewall adjacent to the gate structures that is greater than a second growth rate at a central portion; and, in the chamber, partially removing the epitaxial silicon-rich layer with an etchant with a first etching rate around the sidewall adjacent to the gate structures that is greater than a second etching rate at the central portion.

20 Claims, 15 Drawing Sheets

(51) Int. Cl.
    *H01L 29/66*     (2006.01)
    *H01L 21/02*     (2006.01)
    *H01L 21/768*    (2006.01)
    *H01L 21/3065*   (2006.01)
    *H01L 21/285*    (2006.01)
    *H01L 29/06*     (2006.01)
    *H01L 29/08*     (2006.01)
    *H01L 29/10*     (2006.01)
    *H01L 29/732*    (2006.01)
(52) U.S. Cl.
    CPC ...... *H01L 29/66325* (2013.01); *H01L 29/732* (2013.01); *H01L 29/7325* (2013.01)

METHOD OF FORMING EPITAXIAL SILICON LAYER AND SEMICONDUCTOR DEVICE THEREOF

PRIORITY CLAIM AND CROSS-REFERENCE

This application claims priority to U.S. patent application Ser. No. 62/579,445 filed Oct. 31, 2017, the disclosure of which is hereby incorporated by reference in its entirety.

BACKGROUND

A bipolar junction transistor (BJT) is a widely-employed device that includes a base region, a collector region, and an emitter region. A BJT usually contains two p-n junctions butting each other with one of the component regions common to both junctions. A first junction may be formed by the base and the emitter regions, and a second junction may be formed by the emitter and the collector regions. In operation, current flows through the emitter and collector regions through a gated voltage across the base and emitter regions. Various schemes have been proposed to improve the BJT performance, for example, by reducing the internal resistance or contact resistance among the components of the BJT.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

Figure 1A:
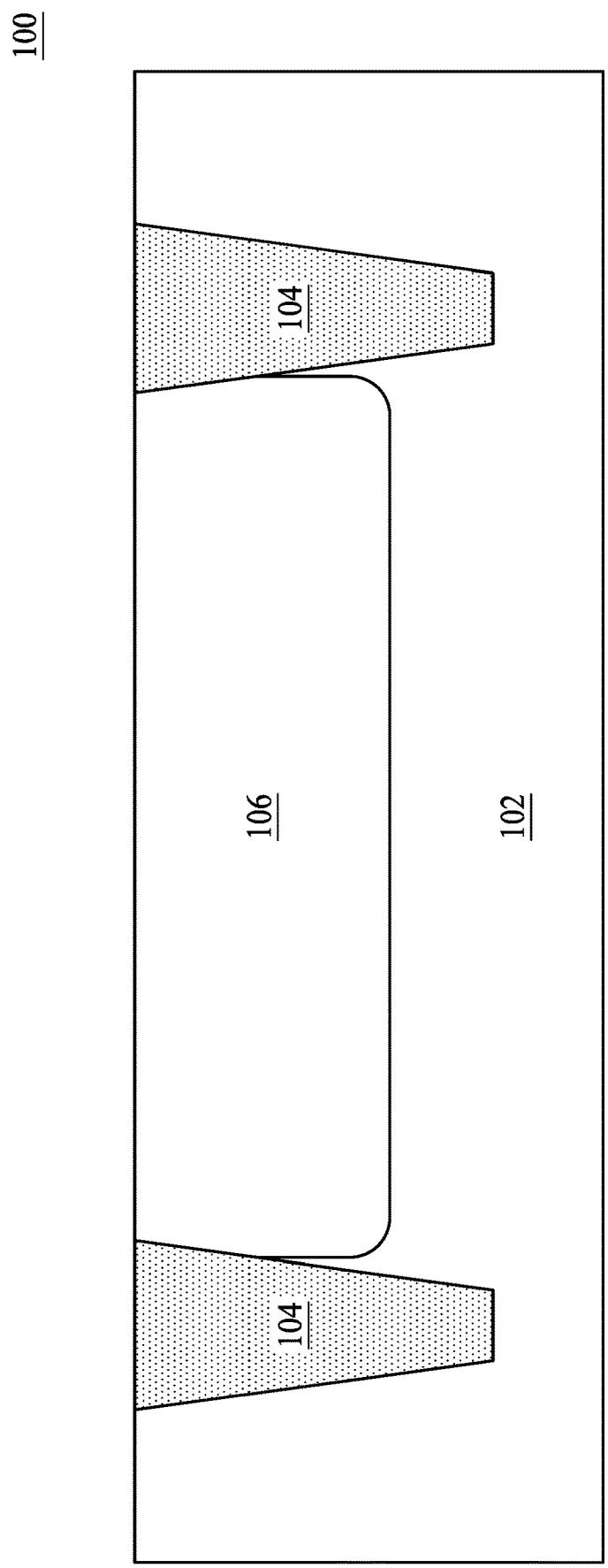
FIGS. 1A through 1O are cross-sectional views of intermediate stages of a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides structures and manufacturing operations of bipolar junction transistors (BJT). The fabrication of BJT devices may encounter more challenges as the scale of BJT devices is reduced. One of the challenges is related to formation of the emitter region. In existing methods, the emitter region is usually constructed as a semiconductive region within a recess and may be formed using a selective epitaxial growth method for obtaining desirable electrical properties due to its crystal structure. However, the upper surface of the epitaxial emitter layer usually has a peak at the central portion and faceted sidewalls at the peripheral region surrounding the central portion. In other words, the area of the upper surface of the emitter layer may not be planar due to the faceted sidewalls. A silicide layer may be formed over the emitter region to reduce contact resistance between the emitter region and overlying conductive structures. The silicide layer may be obtained by depositing a metallic layer and/or silicon layer over the emitter region followed by a silicidation operation. Because the silicon layer is thicker around the faceted sidewalls of the emitter region than that around the peak portion, usually only a limited area of the silicon layer around the peak portion of the emitter region can be successfully reacted into silicide. As a result, the effective contact area between the emitter layer and its overlying features, e.g., metal silicide or contact plug, may be reduced accordingly. The poor contact area between the emitter layer and the contact plug may cause the contact resistance to increase, thus reducing the BJT performance.

In the present disclosure, a planarity enhancement scheme is discussed in forming the emitter layer. A cyclic growth-etching procedure is modified in which a non-selective deposition phase and an etching phase are iterated for forming the emitter layer starting from beneath. Through a proper control of the processing factors, the epitaxial crystal structure of the emitter layer can be maintained as desired by the epitaxial growth phase operation while the planarity of the upper surface of the grown emitter layer can be managed through the etching phase. Therefore, the contact area of the emitter layer is increased. A BJT with a reduced contact resistance can thus be obtained.

Figure 1B:
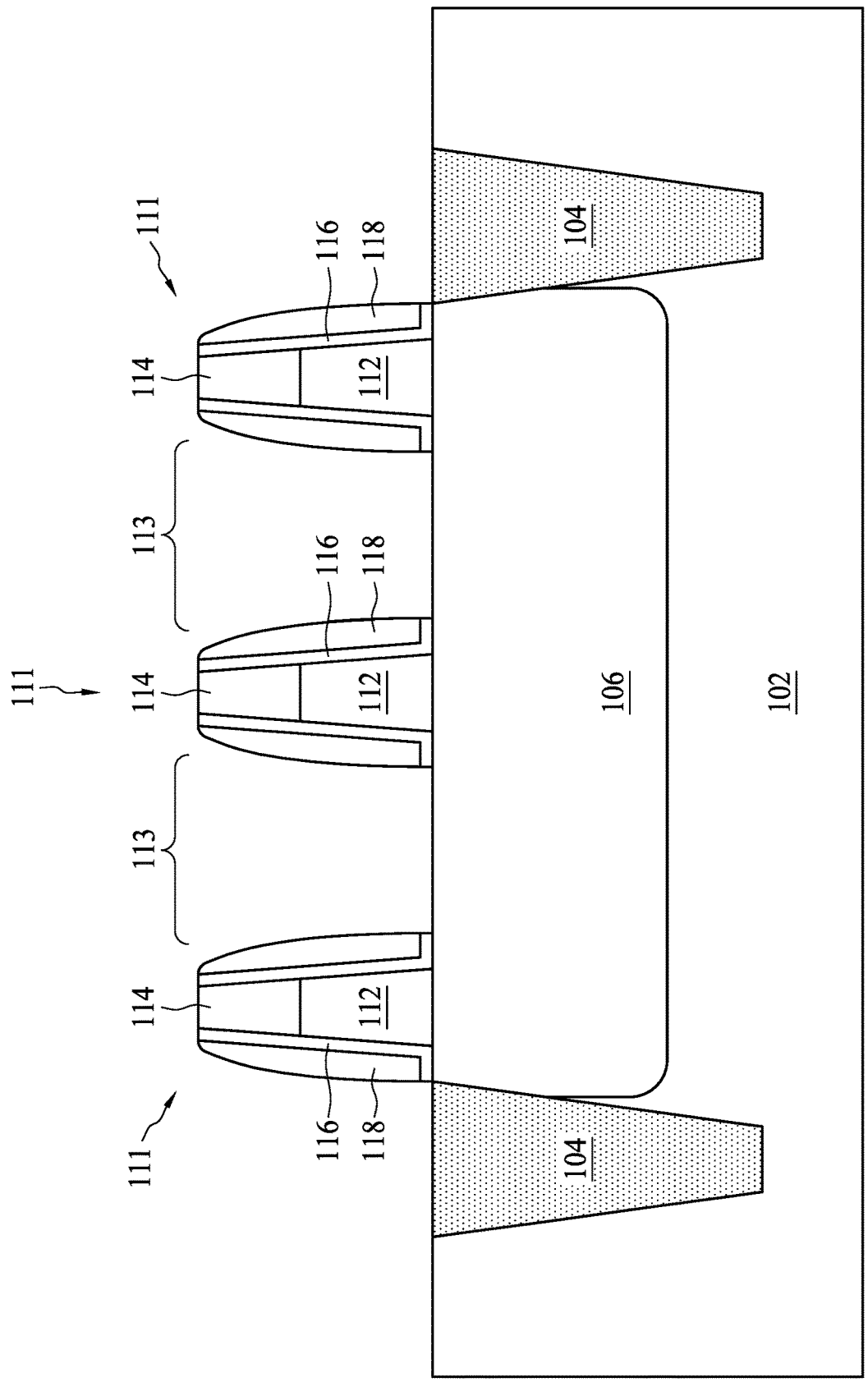
Figure 1C:
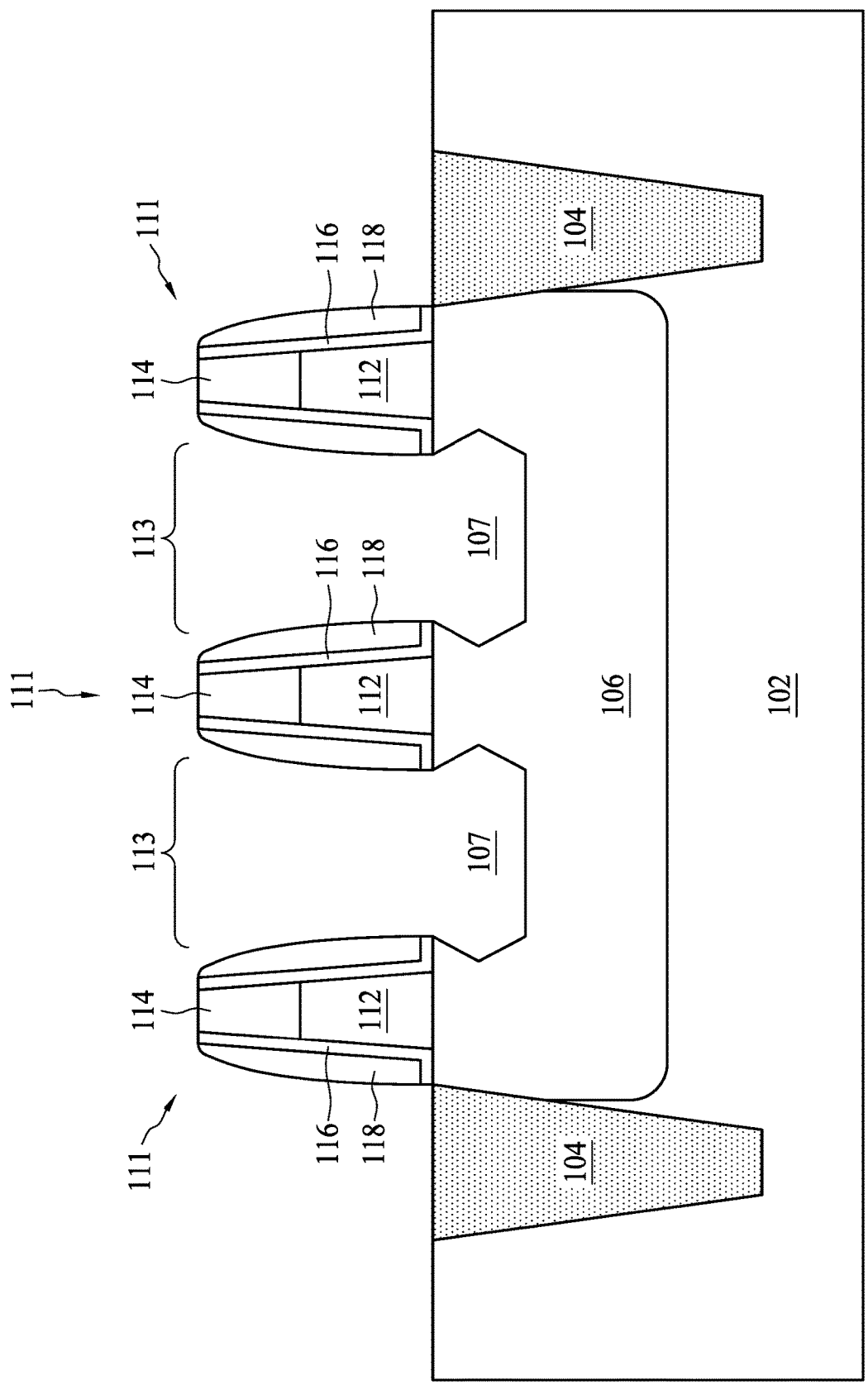
Figure 1D:
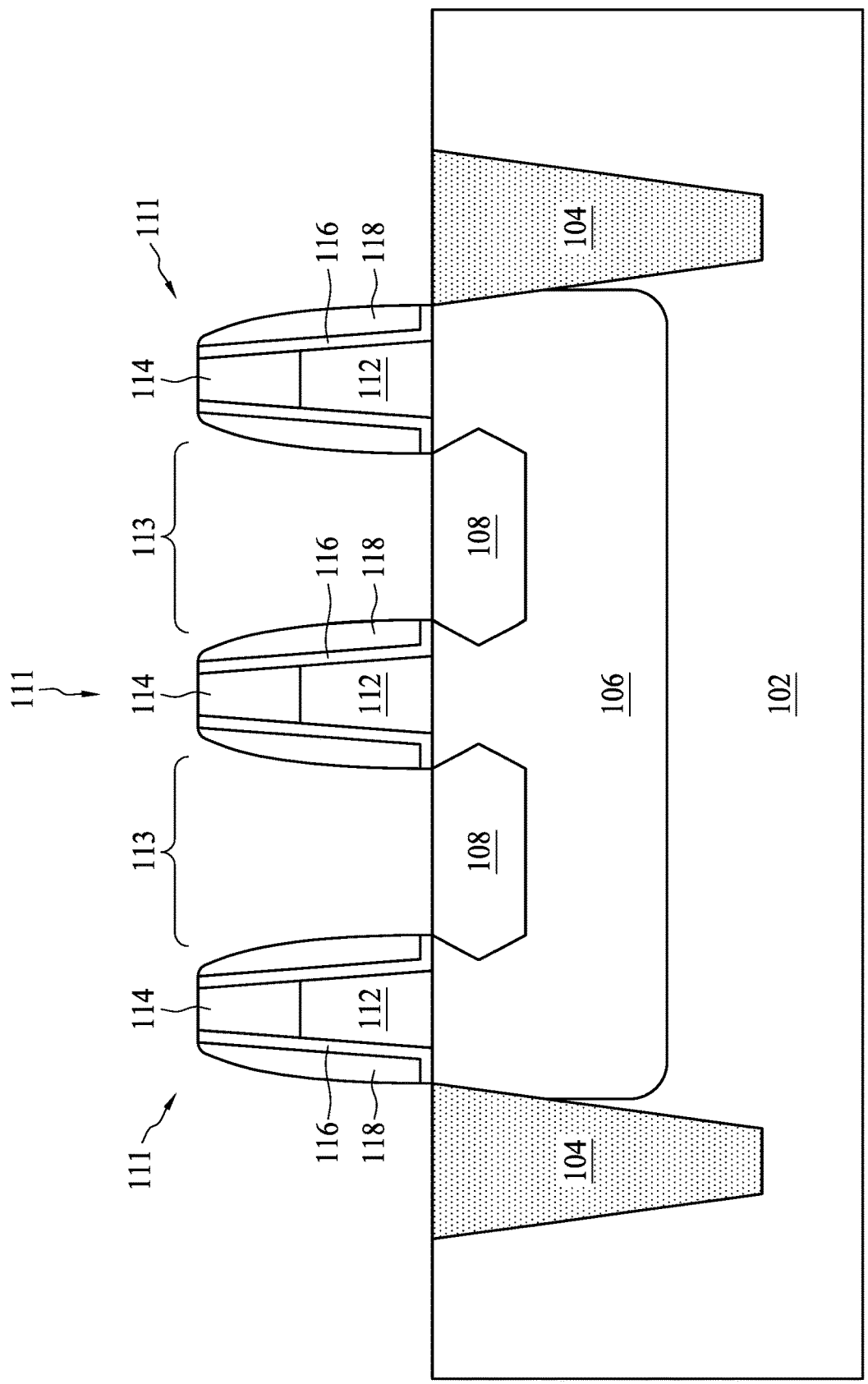
Figure 1E:
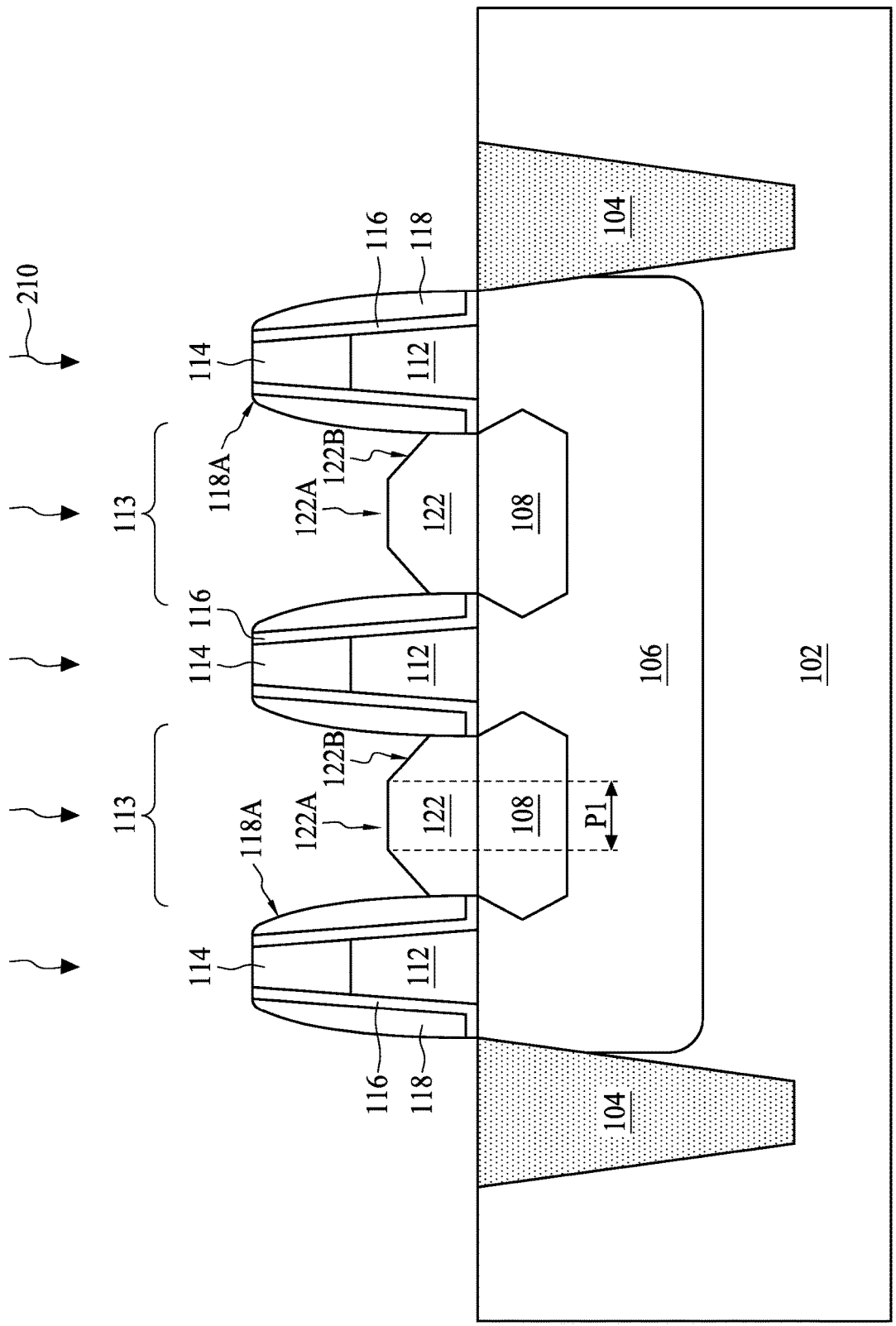
Figure 1F:
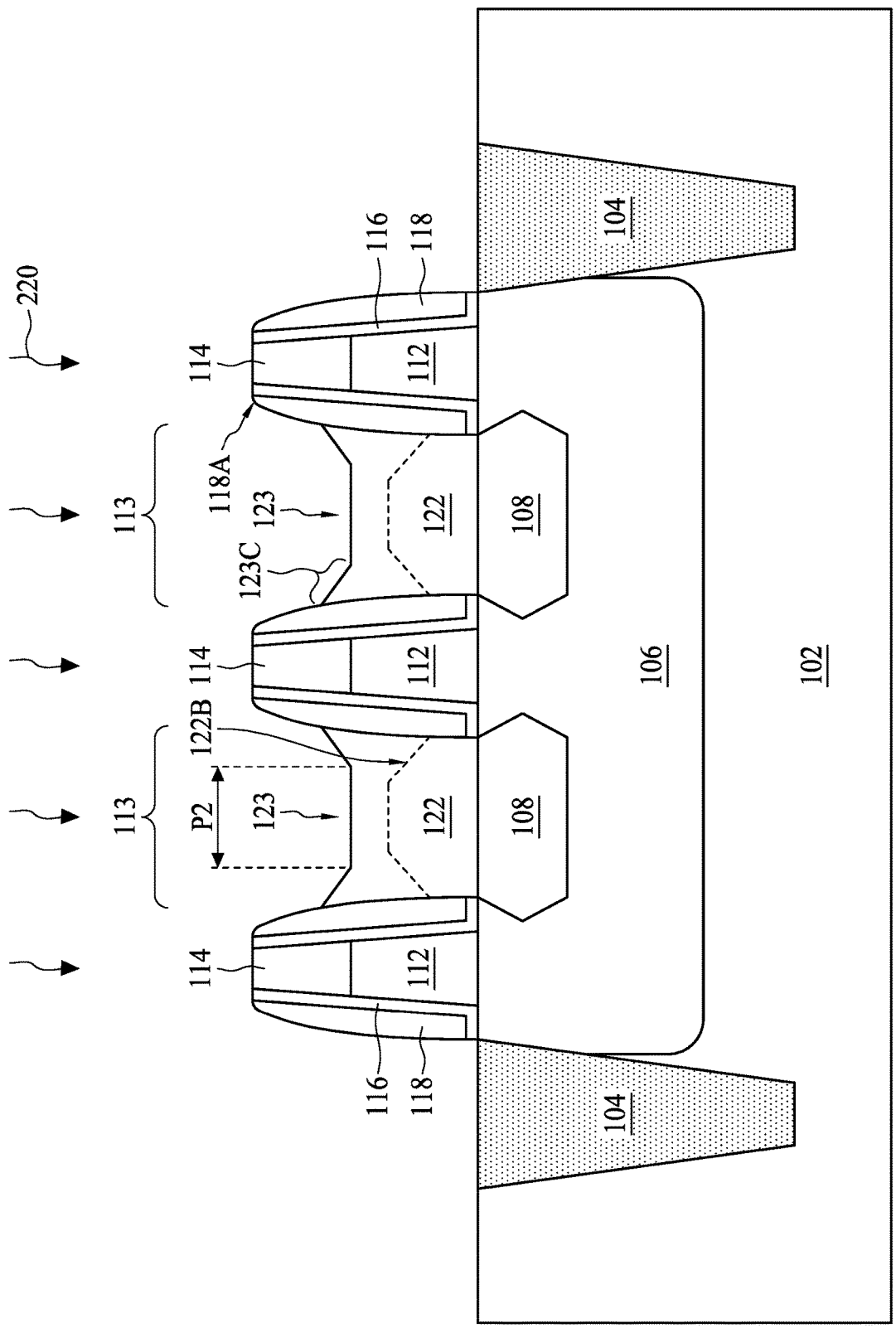
Figure 1G:
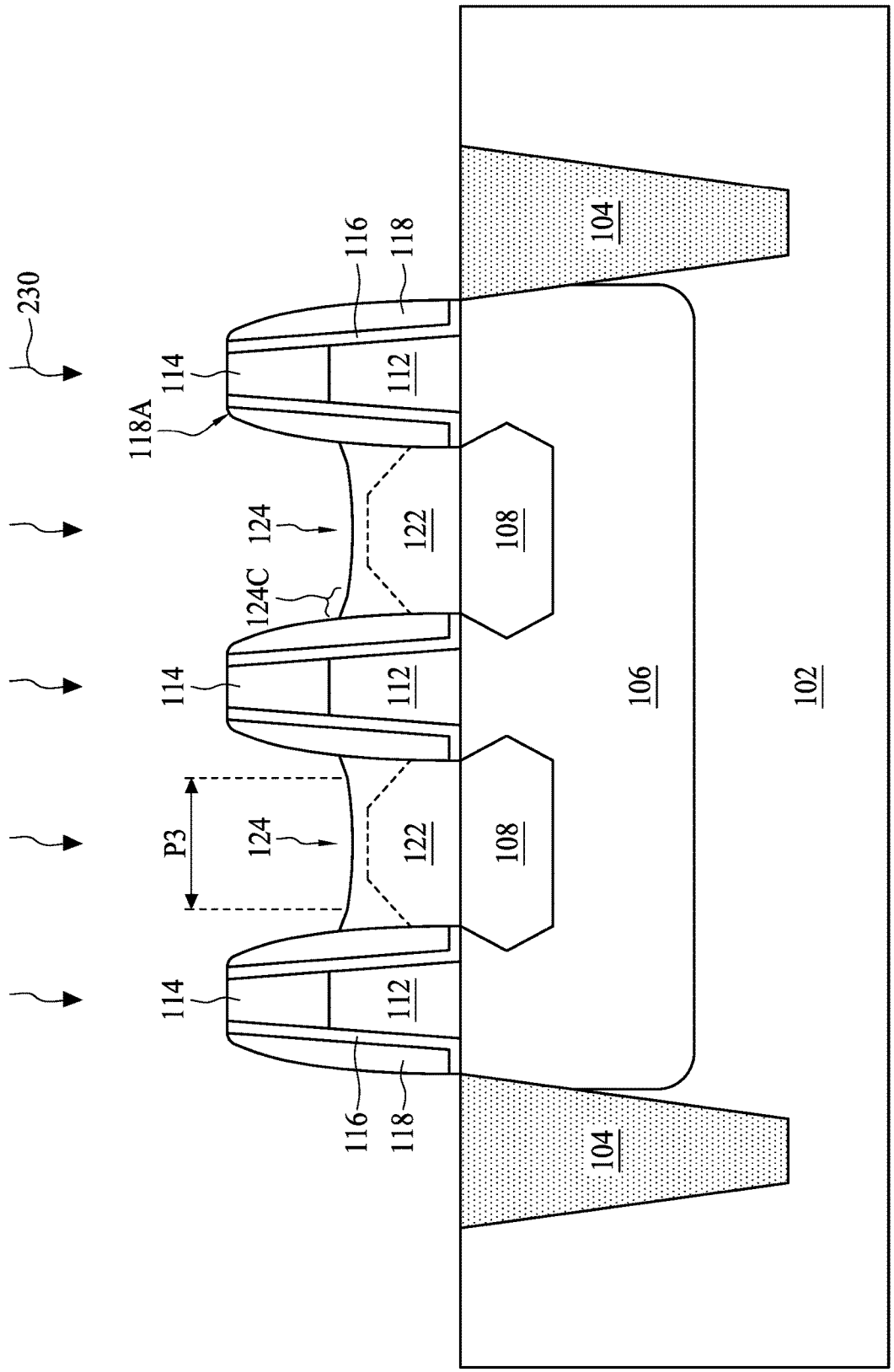
Figure 1H:
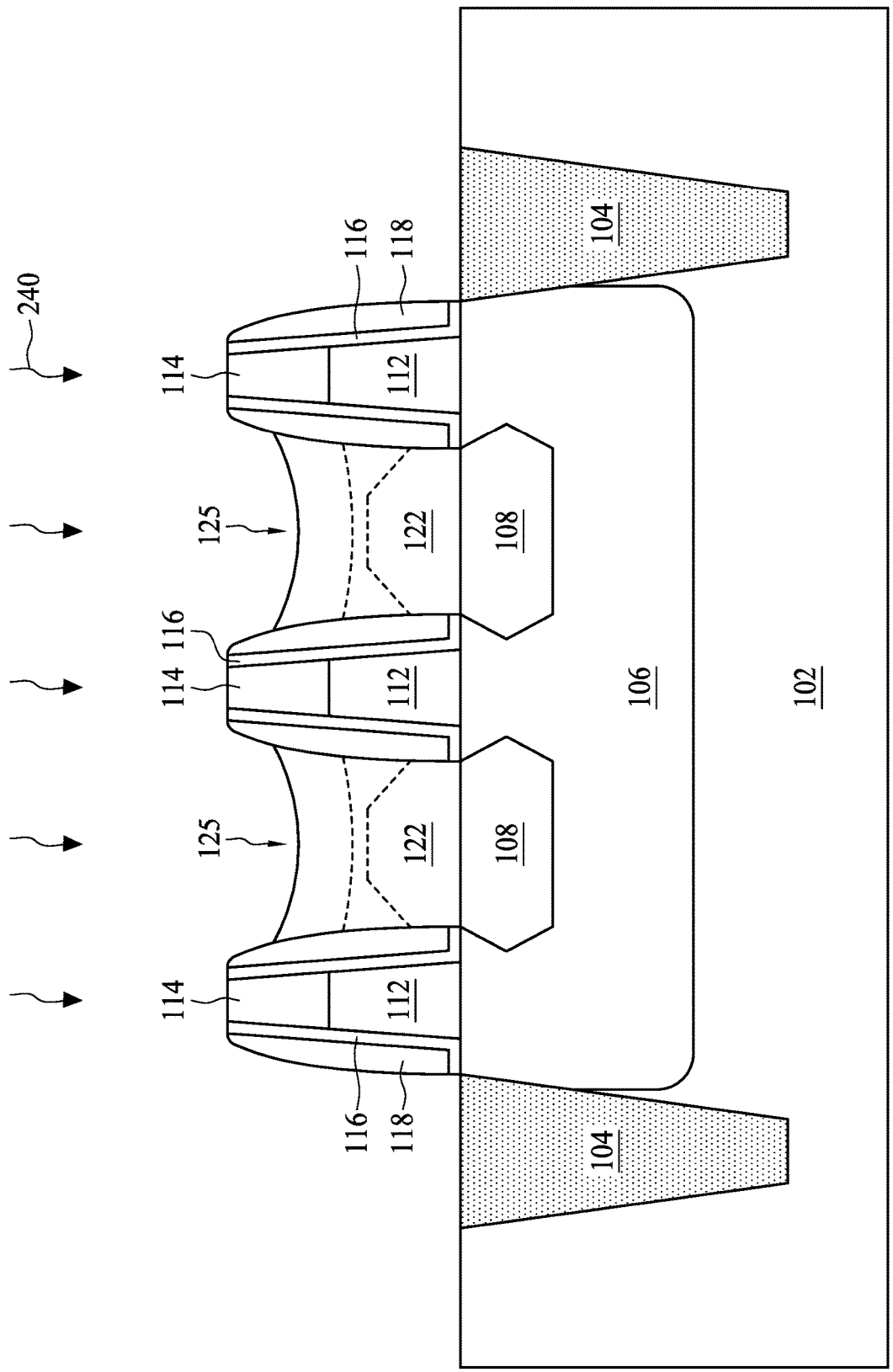
Figure 1I:
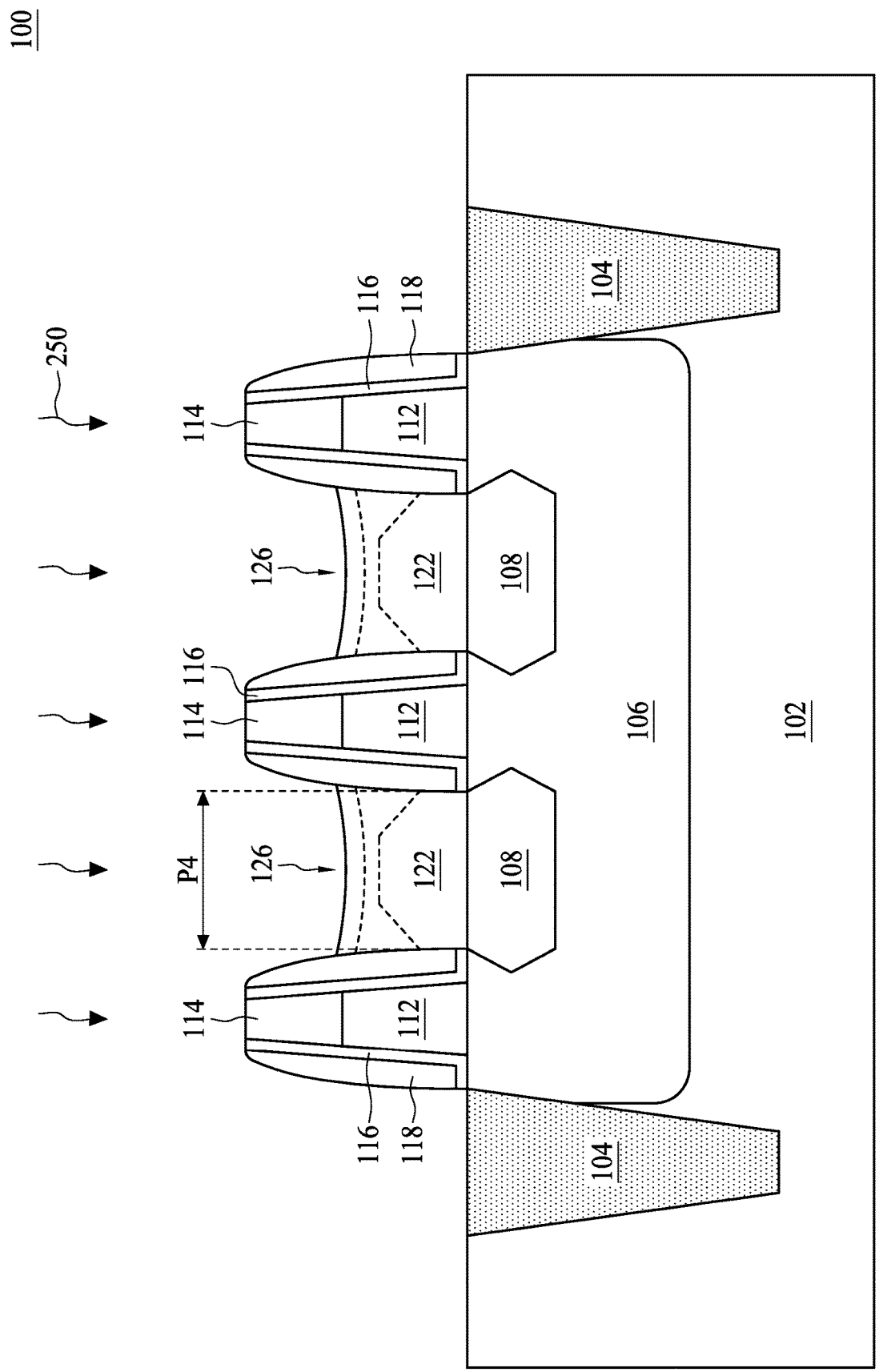
Figure 1J:
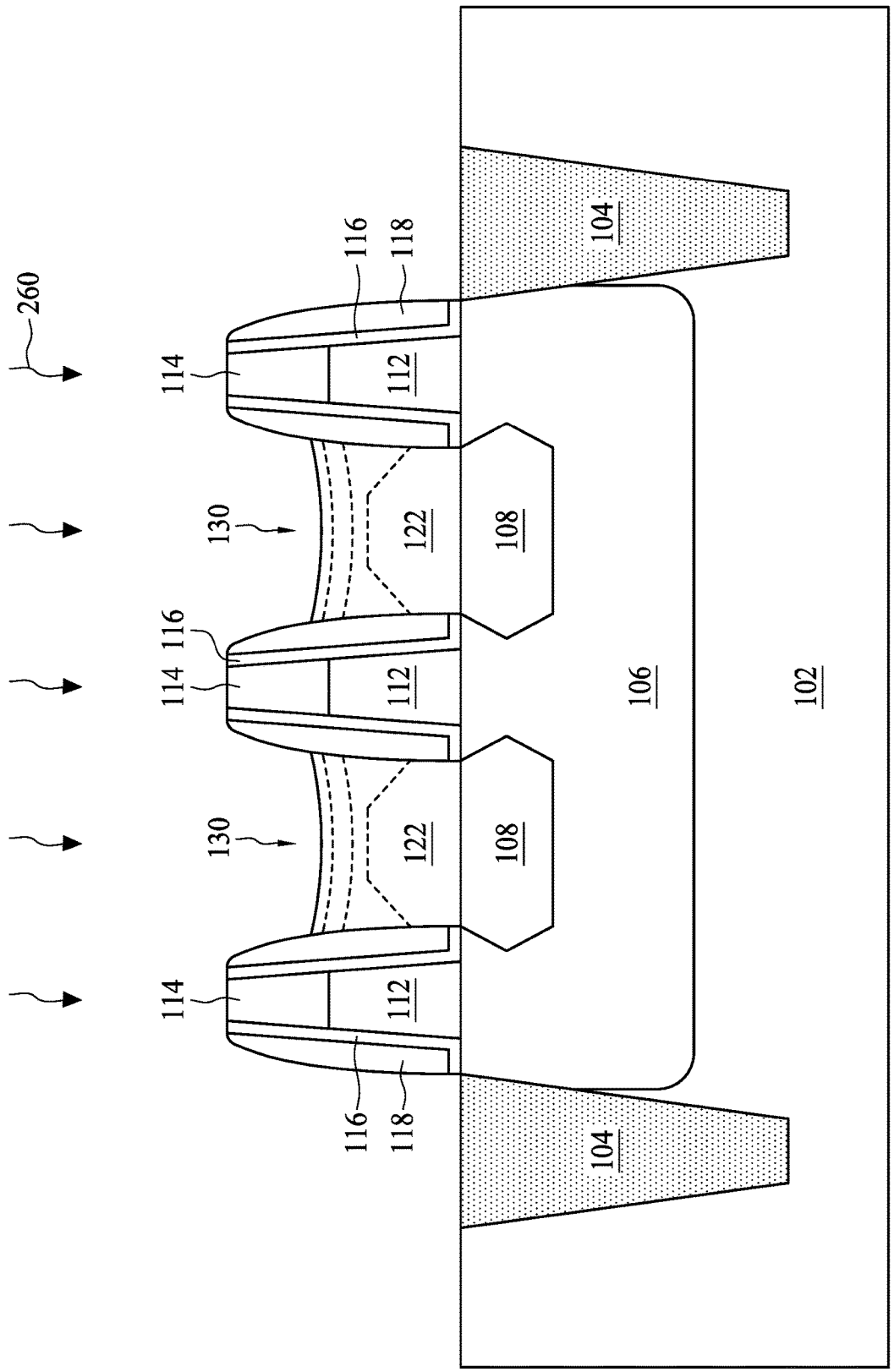
Figure 1K:
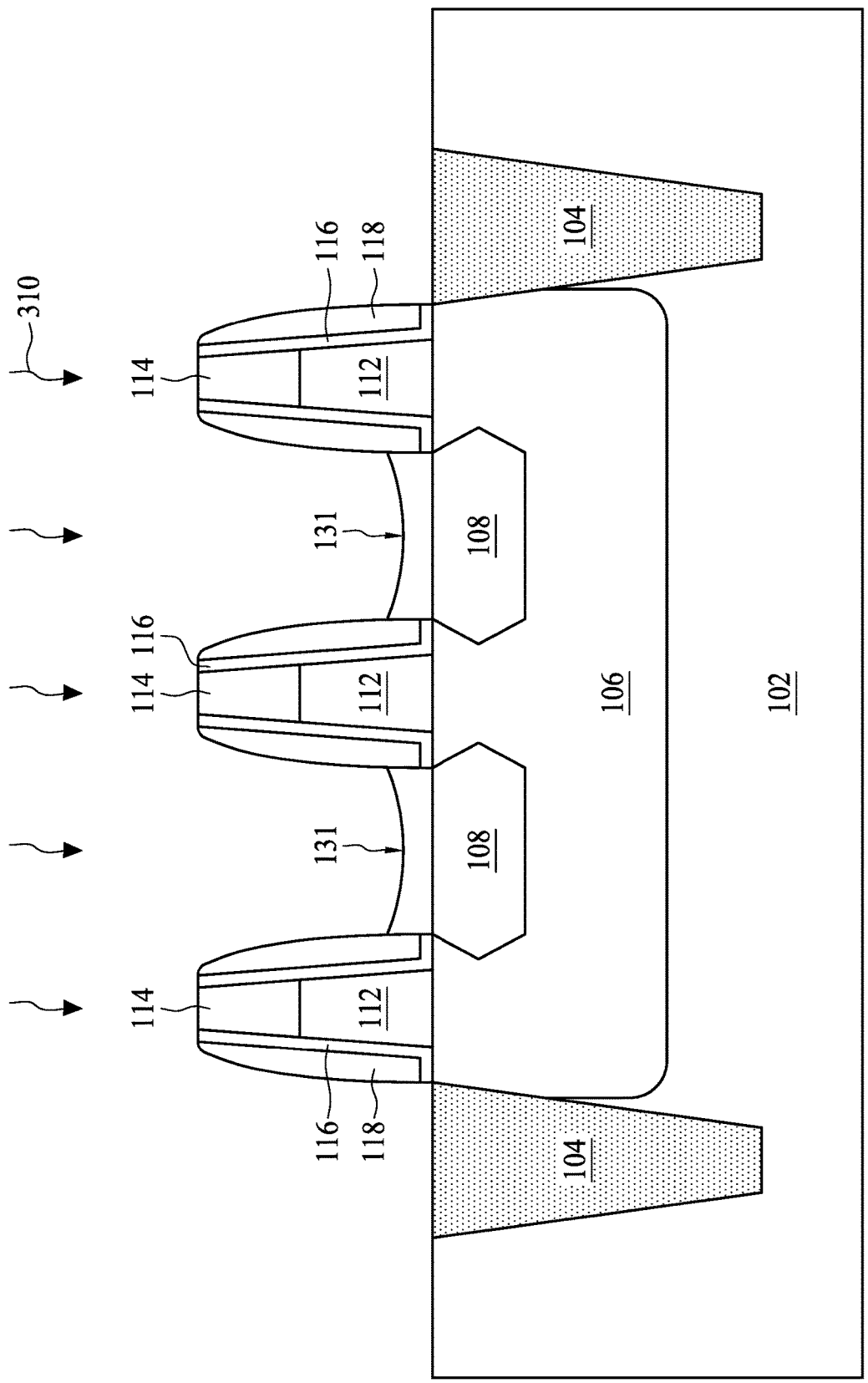
Figure 1L:
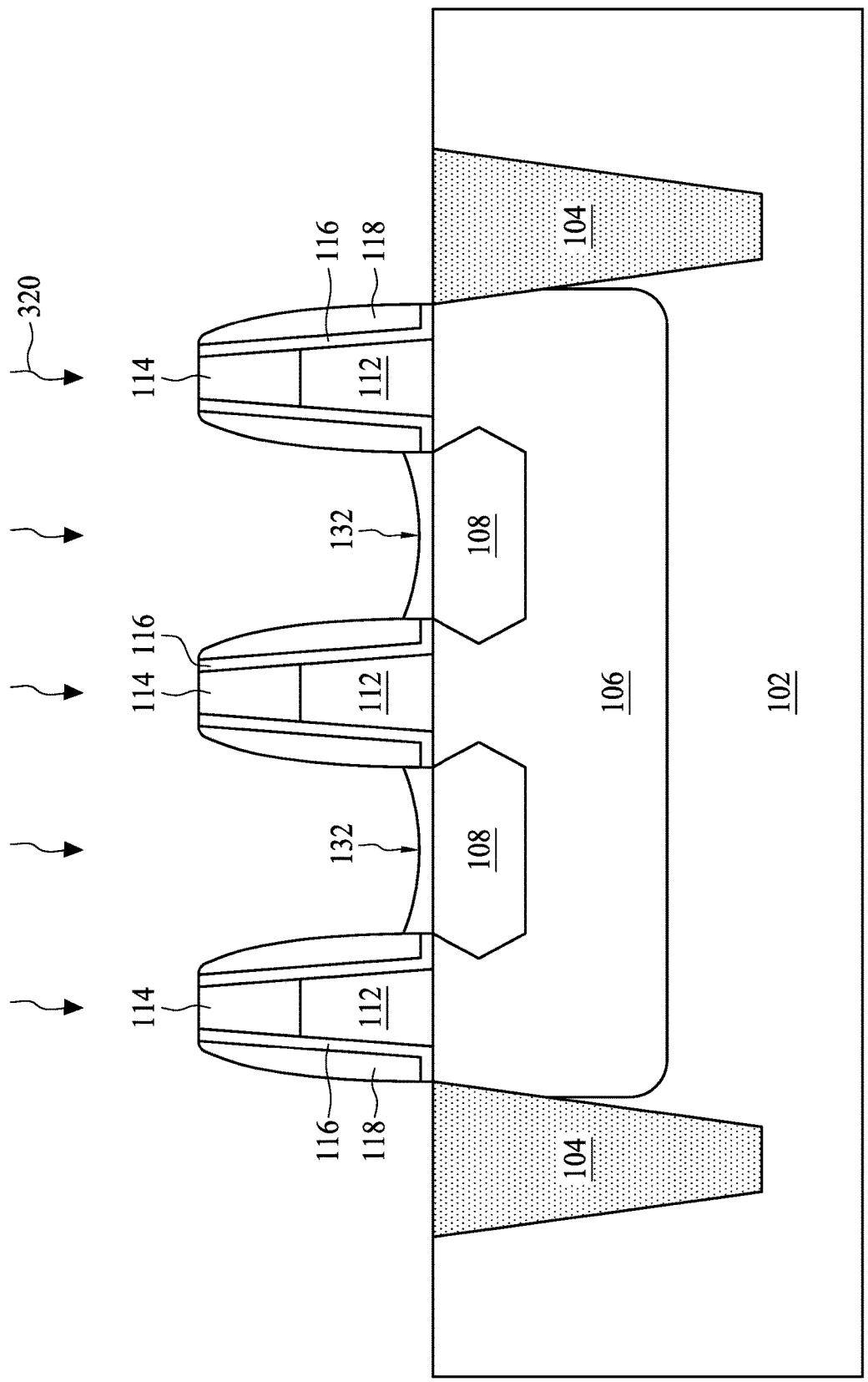
Figure 1M:
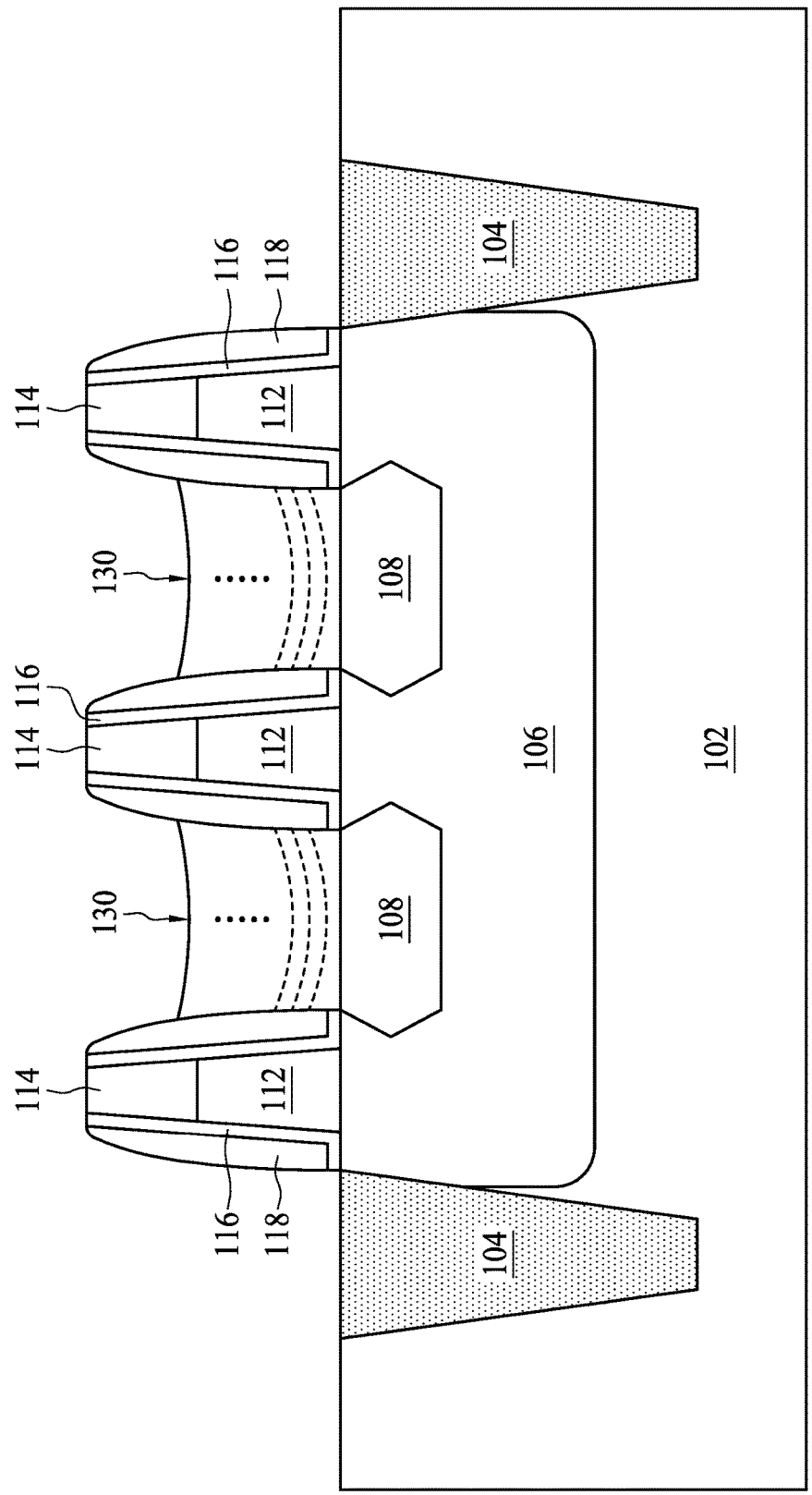
Figure 1N:
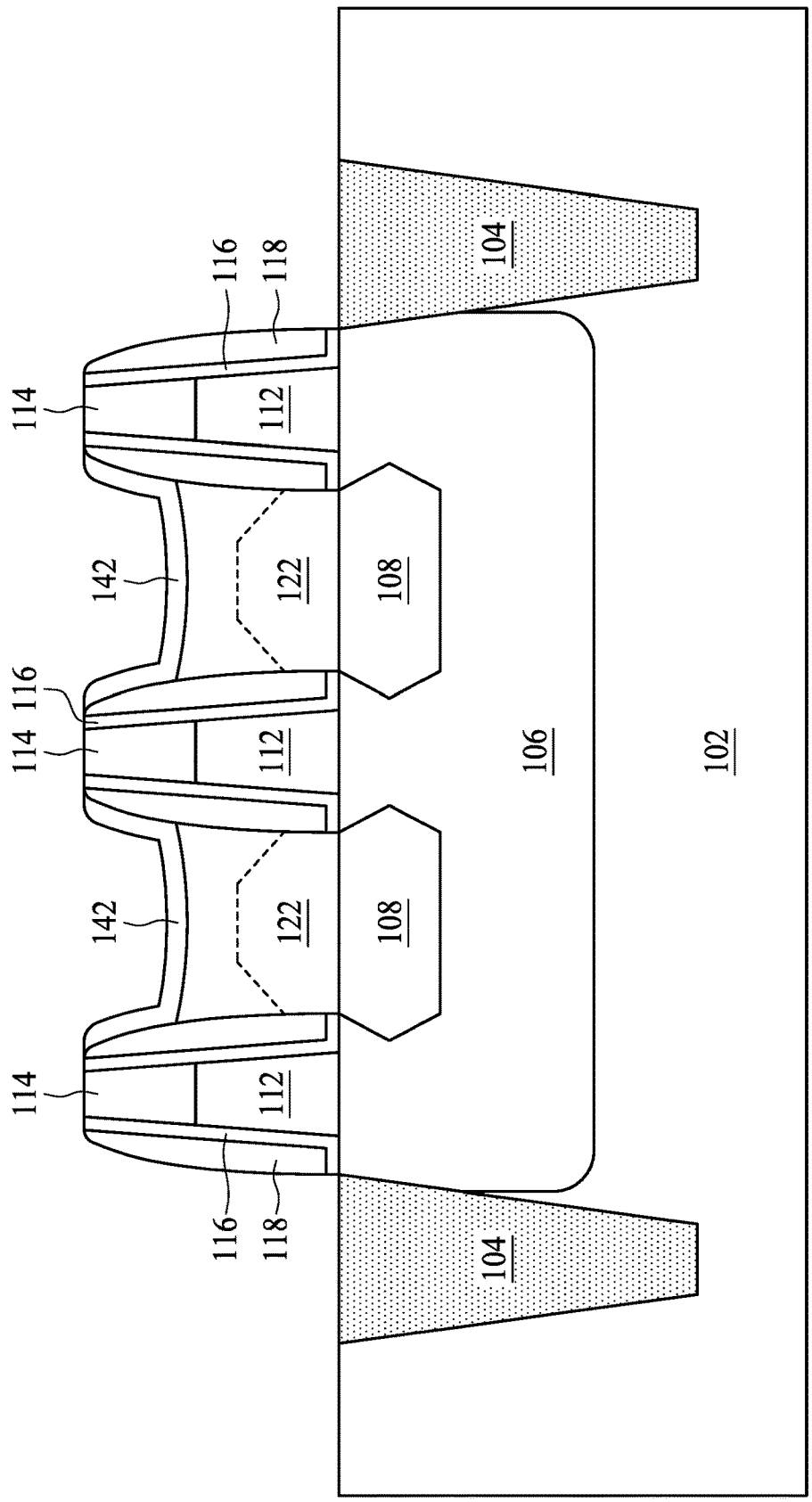
Figure 1O:
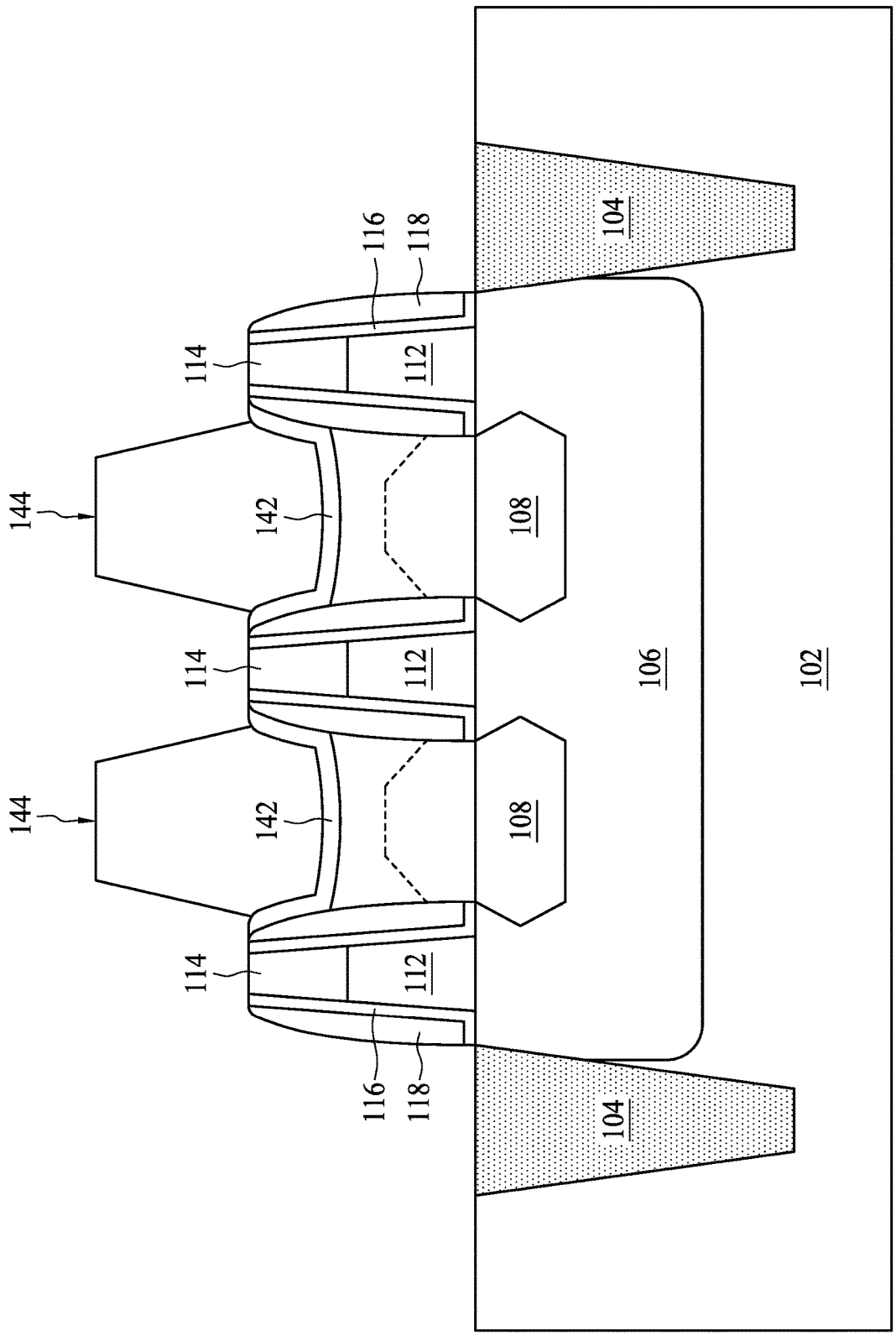

FIGS. 1A through 1O are cross-sectional views of intermediate stages of a method of manufacturing a semiconductor device 100, in accordance with some embodiments. The semiconductor device 100 may be one or more BJT devices. Referring to FIG. 1A, a substrate 102 is provided or received. The substrate 102 includes a semiconductive material such as silicon, germanium, silicon germanium, silicon carbide, gallium arsenide, or the like. Alternatively, the substrate 102 includes a compound semiconductor including gallium arsenic, gallium phosphide, indium phosphide, indium arsenide, indium antimonide, or combinations thereof. In other alternatives, the substrate 102 may include a doped epitaxial layer, a gradient semiconductive layer, and/or a semiconductive layer overlaying another semiconductive layer of a different type, such as a silicon layer on a silicon germanium layer. In an embodiment, the substrate 102 includes monocrystalline silicon or polysilicon. The substrate 102 may be doped with an N-type dopant, such as arsenic, phosphor, or the like, or may be doped with a P-type dopant, such as boron or the like. In the depicted embodiment, the substrate 102 includes bulk silicon doped with P-type dopants.

Next, isolation structures 104 are formed in the substrate 102. The isolation structures 104 are formed for isolating one component of the semiconductor device 100 from other features or devices. The isolation structures 104 may be shallow trench isolation (STI) or local oxidation of silicon (LOCOS). As an exemplary operation for manufacturing the isolation structures 104, several recesses are formed initially by an etching operation, such as a dry etching, a wet etching, a reactive ion etching (RIE) operation, or the like. Next, isolation materials are filled into the recesses to form the isolation structures 104. The isolation materials may be formed of electrically insulating materials, such as dielectric materials. In some embodiments, the isolation structures 104 are formed of oxide, nitride, oxynitride, silicon dioxide, nitrogen-bearing oxide, nitrogen-doped oxide, silicon oxynitride, polymer, or the like. The dielectric material may be formed using a suitable process such as chemical vapor deposition (CVD), physical vapor deposition (PVD), atomic layer deposition (ALD), thermal oxidation, UV-ozone oxidation, or combinations thereof. In some embodiments, a planarization operation, such as grinding or chemical mechanical planarization (CMP) processes, may be used to remove excess materials of the isolation structures 104 and level the top surfaces of the isolation structures 104 with the substrate 102.

Consequently, a first semiconductive region 106 is formed in the substrate 102. The first semiconductive region 106 acts as a collector region of the semiconductor device 100 and is electrically coupled to a collector terminal (not shown). In an embodiment, the first semiconductive region 106 may be formed by implanting dopants by ion implantation. In an embodiment, the first semiconductive region 106 may be formed with the substrate 102. In other words, the first semiconductive region 106 may be seen as a component layer of the substrate 102. In an embodiment, the first semiconductive region 106 has an N-type dopant, such as arsenic or phosphor. In an embodiment, the first semiconductive region 106 has a P-type dopant, such as boron or the like. Alternatively, the first semiconductive region 106 may be epitaxially deposited. In some embodiments, the substrate 102 includes a buried layer (not shown) between a bottom portion of the first semiconductive region 106 and the substrate 102 in order to enhance the electrical property of the first semiconductive region 106. In the depicted example, the first semiconductive region 106 is an N-type region and the buried layer has an N-type dopant with a greater doping concentration than that of the first semiconductive region 106.

Referring to FIG. 1B, gate structures 111 are formed on a surface of the substrate 102. The gate structures 111 are formed over the first semiconductive region 106. Each of the gates structures 111 may be spaced apart from one another. In an embodiment, the gate structures 111 are formed to gate a base current of a base region (e.g., a semiconductive region 130 in FIG. 1D). Gaps 113 are present between two adjacent gate structures 111. Each of the gate structures 111 may include a gate region 112, a mask layer 114, a first spacer 116, and a second spacer 118.

The gate region 112 is formed on the substrate 102. In an embodiment, the gate region 112 includes a conductive material or polysilicon. The conductive material may be selected from copper, tungsten, aluminum, and other suitable metals. The mask layer 114 is formed on the gate region 112. In an embodiment, the mask layer 114 is formed of a dielectric material, such as nitride, oxide, oxynitride, or the like. The first spacer 116 surrounds the gate region 112 and the mask layer 114. Additionally, the second spacer 118 surrounds the first spacer 116 and covers the gate region 112 and the mask layer 114. In an embodiment, the first spacer 116 or the second spacer 118 may be formed of a dielectric material, such as nitride, oxide, oxynitride, or the like. In an embodiment, the first spacer 116 and the second spacer 118 constitute a multi-layered composite spacer structure with different dielectric materials. In the depicted embodiment, the first spacer 116 and the second spacer 118 are formed of silicon oxide and silicon nitride, respectively. As an exemplary operation, the first spacer 116 may be formed by forming a blanket layer covering the substrate 102, the gate region 112 and the mask layer 114 through a suitable operation, such as CVD, PVD, ALD or the like. The second spacer 118 may be formed by initially forming a blanket layer covering the first spacer 116 followed by an etching operation to remove the horizontal portions of the first spacer 118. Portions of the first spacer 116 and the second spacer 118 covering the first semiconductive region 106 may be etched, and thus the gaps 113 are formed and defined by the gate structures 111. Portions of the first spacer 116 and the second spacer 118 covering the mask layer 114 may be etched to expose and level the mask layer 114. A portion of the first semiconductive region 106 is exposed from the bottom of the gap 113.

Referring to FIG. 1C, an etching operation is performed to extend the gaps 113 into the substrate 102. Recesses 107 are formed in the substrate 102 accordingly. The etching operation may be a dry etch, a wet etch, an RIE, or combinations thereof. In an embodiment, the recesses 107 are formed with the gate structures 111 as an etching mask. In an embodiment, a portion of the recesses 107 extends below the gate structures 111.

FIG. 1D shows a formation of second semiconductive regions 108. The second semiconductive regions 108 are formed in the corresponding recesses 107 over the first semiconductive region 106. In an embodiment, the second semiconductive region 108 acts as a base region of the semiconductor device 100 and is electrically coupled to a base terminal (not shown). In an embodiment, the second semiconductive region 108 may have a top surface substantially leveled with the top surface of the substrate 102. In an embodiment, the second semiconductive region 108 extends below the gate structure 111. In an embodiment, the gate structure 111 partially covers the second semiconductive region 108. In an embodiment, a portion of the second semiconductive region 108 is exposed through the gap 113. In an embodiment, the second semiconductive region 108 may include different conductive types and be doped with N-type or P-type dopants. In the embodiment in which the second semiconductive region 108 acts as the base region of the semiconductor device 100, the second semiconductive region 108 has a conductive type opposite to that of the first semiconductive region 106. In the depicted embodiment, the second semiconductive region 108 has a P-type dopant. The second semiconductive region 108 may be formed of a semiconductive material, such as silicon, silicon germanium, or the like. The second semiconductive region 108 may be formed by CVD, ALD, plasma-enhanced CVD (PECVD), high-density plasma CVD (HDPCVD), low-pressure CVD (LPCVD), metal-organic CVD (MOCVD), molecular beam epitaxy (MBE), or the like. In an embodiment, the second semiconductive region 108 is epitaxially formed. In alternative embodiments, the order of operations for forming the gate structure 111 and the second semiconductive region 108 may be exchanged. The gate structures 111 and the gaps 113 may be alternatively formed subsequent to the formation of the second semiconductive region 108. Under that situation, a separate photographic operation may be needed in forming the recess 107 and the second semiconductive region 108.

FIGS. 1E through 1J show a formation of third semiconductive regions 130 (shown in FIG. 1J). In an embodiment, the third semiconductive region 130 acts as an emitter region of the semiconductor device 100. The third semiconductive region 130 can function as a transistor in conjunction with the first semiconductive region 106 (collector region) and second semiconductive region 108 (base region). The third semiconductive region 130 may be formed of silicon-based materials, such as silicon, germanium, or the like. In an embodiment, the third semiconductive region 130 has a conductive type the same as that of the first semiconductive region 106. In the present example, the third semiconductive region 130 has an N-type dopant. Additionally, the third semiconductive region 130 may be formed with a layered structure through a cyclic procedure as described and illustrated with reference to FIGS. 1F and 1G.

Referring to FIG. 1E, initial epitaxial layers 122 are formed in each of the gaps 113 through a selective epitaxial growth (SEG) operation 210. In an embodiment, the initial epitaxial layer 122 is formed over the exposed surface of the second semiconductive region 108. The initial epitaxial layer 122 may be formed by CVD, ALD, plasma-enhanced CVD (PECVD), high-density plasma CVD (HDPCVD), low-pressure CVD (LPCVD), metal-organic CVD (MOCVD), molecular beam epitaxy (MBE), or the like. The initial epitaxial layer 122 is a silicon-rich layer. Throughout the present disclosure, a silicon-rich layer refers to a semiconductive layer containing silicon with an atomic percentage or weight percentage more than 50%. In some embodiments, the silicon-rich layer has an atomic percentage or weight percentage of silicon more than 80%. In an embodiment, the SEG operation 210 uses a reaction gas including a silicon-based precursor and an etchant in forming the initial epitaxial layer 122. In an embodiment, the silicon-based precursor and the etchant are in gaseous phase. In an embodiment, the silicon-based precursor includes silane ($SiH_4$), dicholorosilane (DCS), disilane ($Si_2H_6$), trisilane ($Si_3H_8$), $Si_xH_yCl_z$ (symbols x, y and z denote the relative proportion of the respective element), other silicon-based precursor, or combinations thereof. In an embodiment, the etchant includes HCl, HF, $Cl_2$, $C_xF_yH_z$, $C_xCl_yH_z$, $Si_xF_yH_z$, $Si_xCl_yH_z$, or combinations thereof. During the SEG operation 210, silicon growth and silicon etching coexist in which the silicon-base precursor provide materials for growth and the etchant removes the grown silicon. In an embodiment, the recipe of the SEG operation 210 is tuned such that the growth rate is greater than the etch rate, thus yielding a net effect of silicon growth of the initial epitaxial layer 122.

In an embodiment, the SEG operation 210 is performed at a temperature between about 500° C. and about 900° C. In an embodiment, the SEG operation 210 is performed at a temperature between about 600° C. and about 800° C. In an embodiment, the SEG operation 210 is performed at a pressure between about 10 torr and about 600 torr. In an embodiment, the deposition time of the initial epitaxial layer 122 is between about 30 seconds and about 600 seconds. In an embodiment, the etchant has a ratio less than about 50% by gas flow, in which the ratio of gas flow (or gas flow ratio) is defined as the ratio of the flow rate of the etchant and the total flow rate of the silicon-based precursor plus the etchant. In an embodiment, the etchant has a ratio less than about 50% by gas pressure, in which the pressure ratio is defined as the ratio of the supply pressure of the etchant and the total supply pressure of the silicon-based precursor plus the etchant. In an embodiment, the etchant is between about 30% and about 50% by gas pressure ratio. In an embodiment, the gaseous silicon-based precursor is introduced into a chamber at a flow rate of about 30 sccm to about 300 sccm. In an embodiment, the etchant is introduced into a chamber at a flow rate between about 30 sccm and about 80 sccm, for example, 50 sccm.

The silicon-based precursor of the SEG operation 210 facilitates the selective growth of monocrystalline silicon with a <100> crystallographic plane. The monocrystalline silicon is largely formed on the planar surface 122A of the initial epitaxial layer 122. Additionally, the silicon-based precursor also causes deposition of polysilicon or amorphous silicon of the initial epitaxial layer 122 around sidewalls 118A of the second spacer 118. In the meantime, the etchant readily removes the grown dislocated silicon portion, polysilicon or amorphous silicon. Since most of the polysilicon or amorphous silicon is grown and etched around the sidewall 118A of the second spacer 118, faceted sidewalls 122B are formed at the sidewall 118A of the second spacer 118. As a result, the initial epitaxial layer 122 has a top surface constituted of the planar portion 122A meeting with faceted sidewalls 122B. In an embodiment, the upper surface (comprised of 122A and 122B) of the initial epitaxial layer 122 has a downward concave shape.

In the depicted example, the etchant is between about 30% and about 50% by gas flow ratio. The initial epitaxial layer 122 is selectively formed with monocrystalline silicon at the planar portion 122A with a <100> crystallographic plane and at the faceted sidewall 122B with a crystallographic plane other than <100>, such as <111> or <311>, <711> or the like. The upper surface of the initial epitaxial layer 122 has a planar area P1. In an embodiment, the initial epitaxial layer 122 has a thickness between about 10 nm and about 30 nm.

In an embodiment, the SEG operation 210 dopes the initial epitaxial layer 122. For example, the SEG operation 210 introduces N-type dopants using phosphorous-containing gases such as phosphine ($PH_3$), arsenic-containing gases such as arsine ($AsH_3$), or the like. The SEG operation 210 may alternatively introduce P-type dopants using boron-containing gases such as diborane ($B_2H_6$) or the like. In some embodiments, the initial epitaxial layer 122 is not doped in-situ during the SEG operation 210. In that situation, a separate doping operation, such as an ion implantation or plasma immersion ion implantation (PIII) may be performed in a subsequent step. In an embodiment, an annealing operation, such as furnace annealing, rapid thermal annealing or laser thermal annealing, may be performed to activate dopants of the initial epitaxial layer 122.

Subsequently, as illustrated in FIG. 1F, another epitaxial silicon-rich layer 123 is grown on the initial epitaxial layer 122. The epitaxial silicon-rich layer 123 may be formed through a non-selective epitaxial growth (NEG) operation 220. In an embodiment, the NEG operation 220 is performed in-situ with the SEG operation 210. For example, the SEG operation 210 and the NEG operation 220 are performed in a same chamber. In some embodiments, the SEG operation 210 and the NEG operation 220 are performed in different chambers without releasing vacuum. In an embodiment, the NEG operation 220 is performed using a silicon-based precursor and an etchant. The ingredients of the silicon-based precursor and the etchant used in the NEG operation 220 may be the same as those used in the SEG operation 210. A difference between the SEG operation 210 and the NEG operation 220 is that the completed epitaxial silicon-rich layer 123 includes monocrystalline silicon as well as polysilicon or amorphous silicon due to low to moderate silicon growth selectivity. In an embodiment, the recipe of the NEG operation 220 is tuned such that the growth rate is greater than the etch rate, thus yielding a net effect of silicon growth of the epitaxial layer 123. In an embodiment, the ratio between the growth rate and the etching rate of forming the epitaxial silicon-rich layer 123 is less than the ratio between the growth rate and the etching rate in forming the initial epitaxial layer 122. In an embodiment, the etchant includes a first etching rate used in forming the epitaxial silicon-rich layer 123, which is less than a second etching rate used in forming the initial epitaxial layer 122. Consequently, an amount of polysilicon or amorphous silicon remains and fills the gap 113 between the faceted sidewalls 122B and the gate structures 111 once the epitaxial silicon-rich layer 123 is completed.

The profile of the epitaxial silicon-rich layer 123 can be controlled through tuning of the compositions of the reaction gas such as the silicon-based precursor or the etchant. In an embodiment, the NEG operation 220 is performed with a first growth rate around the sidewall 118A, which is greater than a second growth rate at the central portion of the epitaxial silicon-rich layer 123. The epitaxial silicon-rich layer 123 may have an upper surface that is concave downward. In an embodiment in which the first growth rate is made even greater, the epitaxial-rich layer 123 may have an upper surface that is substantially planar or concave upward due to the thickened peripheral portion. In an embodiment, the etchant includes a first gas flow ratio used in growing the epitaxial silicon-rich layer 123 that is less than a second gas flow ratio used in growing the initial epitaxial layer 122. In an embodiment, the polysilicon or amorphous silicon is grown faster than the monocrystalline silicon such that the grown epitaxial silicon-rich layer 123 has a peripheral portion thicker than a central portion. In an embodiment, the peripheral portion may include monocrystalline silicon and other silicon type, such as polysilicon and amorphous silicon. In an embodiment, although not shown, the completed epitaxial silicon-rich layer 123 includes polysilicon or amorphous silicon on the top surface of the mask layer 114 or sidewalls 118A of the gate structures 111. In an embodiment, the grown epitaxial silicon-rich layer 123 has a sidewall that extends upwardly toward the gate structure 111 and partially covers a sidewall of the gate structure 111. In an embodiment, the grown epitaxial silicon-rich layer 123 has an angled corner 123C contacting the sidewall 118A of the gate structure 111. In an embodiment, the angled corner 123C is grown on the sidewall 118A at both sides. In an embodiment, the peripheral portion, including the angled corners 123C, may include monocrystalline silicon and other crystal types such as polysilicon and amorphous silicon. Referring to FIG. 1E and FIG. 1F, the upper surface of the epitaxial silicon-rich layer 123 has a planar area P2 greater than the planar area P of the initial epitaxial layer 122.

In an embodiment, the NEG operation 220 is performed at a temperature between about 500° C. and about 900° C. In an embodiment, the NEG operation 220 is performed at a temperature between about 600° C. and about 700° C. In an embodiment, the NEG operation 220 is performed at a pressure between about 10 torr and about 600 torr. In an embodiment, the deposition time of the epitaxial silicon-rich layer 123 is between about 30 seconds and about 600 seconds. In an embodiment, the etchant is less than about 50% by gas flow ratio. In an embodiment, the etchant is between about 5% and about 30% by gas flow ratio, for example, 10%. In an embodiment, the etchant is less than about 50% by gas pressure ratio. In an embodiment, the etchant is between about 5% and about 30% by gas pressure ratio. In an embodiment, the gaseous silicon-based precursor is introduced into a chamber at a flow rate between about 250 sccm and about 300 sccm. In an embodiment, the etchant is introduced into a chamber at a flow rate between about 30 sccm and about 50 sccm, for example, 40 sccm.

FIG. 1G demonstrates an etching operation against the epitaxial silicon-rich layer 123. A thinned epitaxial silicon-rich layer 124 is formed accordingly. The epitaxial silicon-rich layer 124 may be formed through an etching operation 230. In an embodiment, the etching operation 230 is performed in-situ with the NEG operation 220. For example, the NEG operation 220 and the etching operation 230 are performed in a same chamber. In an embodiment, the etching operation 230 is performed using a reaction gas including silicon-based precursor and an etchant. The ingredients of the silicon-based precursor and the etchant used in the etching operation 230 may be the same as those used in the NEG operation 220 or the SEG operation 210. A difference between the NEG operation 220 and the etching operation 230 is that, through the NEG operation 220, more silicon is deposited than is etched away; through the etching operation 230, more silicon is etched than is deposited. The growth rate of the etching operation 230 may be made less than the etching rate in forming the epitaxial silicon-rich layer 124, thus yielding a net effect of etch. In an embodiment, the etchant includes a first gas flow ratio used in forming the epitaxial silicon-rich layer 124 that is greater than a second gas flow ratio used in growing the epitaxial silicon-rich layer 123. A profile control of the epitaxial silicon-rich layer 124 can be achieved through tuning of the compositions of the silicon-based precursor or the etchant. In an embodiment, the etching operation 230 is performed such that the etchant includes a first etching rate around a sidewall portion adjacent to the sidewall 118A that is greater than a second etching rate at the central portion of the epitaxial silicon-rich layer 124. In an embodiment, the polysilicon or amorphous silicon is etched faster than the monocrystalline silicon such that the reshaped epitaxial silicon-rich layer 124 has a greater planar area around the center portion. In an embodiment, the peripheral portion extends upwardly toward the gate structure 111 and partially covers a sidewall of the gate structure 111. In an embodiment, the grown epitaxial silicon-rich layer 124 has an etched angled corner 124C with a smaller height as compared to the angled corner 123C of the epitaxial silicon-rich layer 123. In an embodiment, one or all of the angled corners 124C contacting the gate structures 111 are etched away thereby leading to a substantially planer upper surface around the sidewall portion. Referring to FIG. 1F and FIG. 1G, the upper surface of the epitaxial silicon-rich layer 124 has a planar area P3 greater than the planar area P2 of the epitaxial silicon-rich layer 123. In an embodiment, the epitaxial silicon-rich layer 124 has a thickness measured at the central portion less than the thickness of the epitaxial layer 123 in order to achieve a better planarity of the upper surface of the epitaxial silicon-rich layer 124.

In an embodiment, the etching operation 230 is performed at a temperature between about 700° C. and about 900° C. In an embodiment, the etching operation 230 is performed at a temperature between about 600° C. and about 800° C. In an embodiment, the etching operation 230 is performed at a pressure between about 10 torr and about 60 torr, for example, 30 torr. In an embodiment, the etching operation 230 is performed at a pressure between about 20 torr and about 40 torr. In an embodiment, the etching time of the etching operation 230 is between about 30 seconds and about 600 seconds. In the depicted embodiment, the etching operation 230 includes a reaction gas comprised of the silicon-based precursor plus the etchant in which the etchant includes HCL with a gas flow ratio greater than about 50%. In an embodiment, the etching operation 230 includes a reaction gas comprised of the silicon-based precursor plus the etchant in which the etchant includes HCL with a gas flow ratio between about 50% and about 100%. In an embodiment, the etchant includes HCL only. In an embodiment, the etchant is introduced into a chamber at flow rate of between about 250 sccm and about 350 sccm, for example, 300 sccm.

In an embodiment, the SEG operation, the NEG operation 220 and the etching operation 230 described and illustrated with reference to FIGS. 1E through 1G collectively demonstrate one exemplary cycle of growing a component layer of the third semiconductive region 130. The cycle of operations can be repeated to achieve a desirable thickness. In an embodiment, the SEG operation may not be performed in each of the cycles (e.g., performed only once), while the NEG operation 220 and the etching operation 230 are performed in each cycle. The cycle of operations can be repeated to achieve a desirable thickness. FIGS. 1H and 1I show one more cycle of growing a second epitaxial silicon-rich layer on the epitaxial silicon-rich layer 124. Referring to FIG. 1H, an NEG operation 240 is performed to form an epitaxial silicon-rich layer 125 on the as-grown epitaxial silicon-rich layer 124. The recipe of the NEG operation 240 may be similar to that used in NEG operation 220. In an embodiment, the thickness or the surface profile of the epitaxial silicon-rich layer 125 may be different than those of the epitaxial silicon-rich layer 123 even though both layers are formed under a same recipe, because the surface widths for deposition and the surface conditions for epitaxy may not be identical to one another. Subsequently, an etching operation 250 is performed in FIG. 1I for etching the as-deposited epitaxial silicon-rich layer 125, thereby forming an epitaxial silicon-rich layer 126. In an embodiment, the SEG operation 250 includes a recipe similar to that used in the etching operation 230. In an embodiment, the upper surface of the grown epitaxial silicon-rich layer 126 has a planar area P4 greater than the planar area P3 of the epitaxial silicon-rich layer 124.

FIG. 1J shows a completion of the third semiconductive region 130. The third semiconductive region 130 is an epitaxial silicon-rich layer comprising layered epitaxial silicon layers. The afore-mentioned cycles of epitaxial deposition can be repeated to pursue a predetermined thickness of the third semiconductive region 130. A representative operation 260 is illustrated for performing the necessary epitaxial deposition and/or etching steps. Moreover, the third semiconductive region 130 comprises an upper surface with a sufficiently planar area that helps attain low contact resistance. An enhanced planarity or thickness control may be anticipated through more cycles of epitaxial deposition and etching, each cycle providing finer increment in thickness with better surface planarity. Additionally, the supply amount of the etchant in each etching operation (e.g., operations 230 and 250) may be adjusted to determine different surface profiles. In an embodiment, each of the third semiconductive regions 130 includes a thickness between about 60 nm and about 100 nm. In an embodiment, each of the third semiconductive regions 130 includes a thickness between about 70 nm and about 90 nm. In an embodiment, each of the third semiconductive regions 130 includes a thickness deviation within about 15%, in which the thickness deviation is defined as a ratio between a highest (or lowest) location on the upper surface of the third semiconductive region 130 and the average thickness of the third semiconductive region 130. In an embodiment, each of the third semiconductive regions 130 includes a thickness deviation within about 10%. In an embodiment, the third semiconductive region 130 includes a central portion and a peripheral portion having a top higher than the central portion. In some examples, the top of the peripheral portion is higher than the central portion by less than about 10 nm.

FIGS. 1K thorough 1M illustrate a method of forming the third semiconductive region 130 in accordance with some embodiments. A major difference between the present embodiment and the previous embodiment lies in that the initial epitaxial layer 122 may be absent from the formation procedure. Instead, as shown in FIGS. 1K and 1L, a first cycle of epitaxial deposition and etching is performed on the second semiconductive region 108. Initially, an epitaxial silicon-rich layer 131 is formed on the exposed surface of the second semiconductive region 108 through an NEG operation 310. In an embodiment, the NEG operation 310 includes a recipe similar to those used in the NEG operation 220 or 240. In other words, a non-selective epitaxial silicon-rich layer 131 is grown having few or no faceted sidewalls at the peripheral portion. Rather, during the epitaxial growth, polysilicon or amorphous silicon is grown around the sidewall. In an embodiment, the epitaxial silicon-rich layer 131 includes a peripheral portion thicker than a central portion. Subsequently, the epitaxial silicon-rich layer 131 is etched through an etching operation 320, as shown in FIG. 1L. A thinned epitaxial silicon-rich layer 132 is formed accordingly. In an embodiment, the etching operation 320 is performed in-situ with the NEG operation 310. For example, the NEG operation 310 and the etching operation 320 are performed in a same chamber. In an embodiment, the ingredient of the silicon-based precursor and the etchant used in the etching operation 320 may be the same as those used in the SEG operation 310. FIG. 1M illustrates the completion of the third semiconductive region 130. The dashed lines in the third semiconductive region 130 represent multiple epitaxial silicon-rich layers through an iterative deposition/etching procedure.

In FIG. 1N, a conductive layer 142 is formed over the third semiconductive region 130. The conductive layer 142 serves to reduce the contact resistance between the third semiconductive region 130 and overlying structures. In an embodiment, the conductive layer 142 includes a silicide layer. In an embodiment, a silicide layer may be formed of tungsten silicide, titanium silicide, cobalt silicide, nickel silicide or the like. Taking tungsten silicide as an example, the silicide layer may be formed by reacting tungsten fluoride ($WF_6$) with silane ($SiH_4$). Alternatively, the silicide layer 142 may be formed by depositing a metallic layer comprised of selected metal covering the third semiconductive region 130. An annealing operation may be performed to aid in reacting the metallic atoms of the metallic layer with the silicon atoms of the third semiconductive region 130. A metal silicide layer 142 is thus formed. In an embodiment, an entire area of the upper surface of the epitaxial silicon-rich layer 142 is reacted into a metal silicide. In some embodiments, portions of the conductive layer 142 not reacting with the silicon may be removed. As discussed previously, the conductive layer 142 has a bottom portion contacting the upper surface of the third semiconductive region 130. Since the upper surface of the third semiconductive region 130 has been substantially planarized, the effective contact area between the third semiconductive region 130 and the conductive layer 142 is increased accordingly. As a result, the contact resistance can be reduced. In an embodiment, the effective resistance of the third semiconductive region 130 is below 20 Ohms.

Subsequently, a conductive plug 144 is formed over the conductive layer 142. The conductive plug 144 may be formed of conductive materials such as titanium, tantalum, titanium nitride, tantalum nitride, copper, copper alloys, nickel, tin, gold, or combinations thereof. The conductive plug 144 may be formed by any suitable methods, such as CVD, PVD, sputtering, and the like.

The present disclosure provides a method of manufacturing a semiconductor device. The method includes: providing a substrate including a first semiconductive region of a first conductive type and gate structures over the first semiconductive region, where a gap between the gate structures exposes a portion of the first semiconductive region; and forming a second semiconductive region of a second conductive type in the gap starting from the exposed portion of the first semiconductive region. The forming of the second semiconductive region includes: growing, in a chamber, an epitaxial silicon-rich layer with a first growth rate around a sidewall adjacent to the gate structures that is greater than a second growth rate at a central portion; and, in the chamber, partially removing the epitaxial silicon-rich layer with an etchant with a first etching rate around the sidewall adjacent to the gate structures that is greater than a second etching rate at the central portion.

The present disclosure provides a method of manufacturing a semiconductor device. The method includes providing a substrate having a first semiconductive region of a first conductive type and gate structures over the first semiconductive region, where a gap between the gate structures exposes a portion of the first semiconductive region; and forming a second semiconductive region of a second conductive type in the gap starting from the exposed portion of the first semiconductive region. The forming of the second semiconductive region includes growing, in a chamber, an epitaxial silicon-rich layer with a precursor and an etchant; and, in the chamber, partially removing the epitaxial silicon-rich layer with the etchant. A first gas flow ratio of the etchant used in growing the epitaxial silicon-rich layer is less than a second gas flow ratio of the etchant used in partially removing the epitaxial silicon-rich layer.

The present disclosure provides a semiconductor structure which includes a substrate having a first semiconductive region of a first conductive type and a second semiconductive region of a second conductive type different from the first conductive type over the first semiconductive region. The semiconductor structure also includes gate structures over the second semiconductive region and a third semiconductive region of the first conductive type between the gate structures over the second semiconductive region. The third semiconductive region is formed of epitaxial silicon-rich layers and includes a thickness deviation within about 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a substrate including a first semiconductive region of a first conductive type and gate structures over the first semiconductive region, wherein a gap between the gate structures exposes a portion of the first semiconductive region; and
   forming a second semiconductive region of a second conductive type in the gap starting from the exposed portion of the first semiconductive region, comprising:
      growing, in a chamber, an epitaxial silicon-rich layer with a first growth rate around a sidewall adjacent to the gate structures that is greater than a second growth rate at a central portion; and
      in the chamber, partially removing the epitaxial silicon-rich layer with an etchant with a first etching rate around the sidewall adjacent to the gate structures that is greater than a second etching rate at the central portion.

2. The method according to claim 1, wherein the etchant is in a gaseous phase and has a first gas flow ratio of greater than about 50%.

3. The method according to claim 1, wherein growing an epitaxial silicon-rich layer comprises growing the epitaxial silicon-rich layer with the etchant.

4. The method according to claim 3, wherein a second gas flow ratio of the etchant is less than about 50% during the growing of the epitaxial silicon-rich layer.

5. The method according to claim 1, wherein the grown epitaxial silicon-rich layer comprises monocrystalline silicon at the central portion and comprises polycrystalline or amorphous silicon around the sidewall adjacent to the gate structures.

6. The method according to claim 1, wherein the epitaxial silicon-rich layer comprises an angled corner around the sidewall adjacent to the gate structures.

7. The method according to claim 1, wherein forming the second semiconductive region comprises forming an initial epitaxial layer on the first semiconductive region prior to growing the epitaxial silicon-rich layer, and forming the initial epitaxial layer comprises a third growth rate at a central portion greater than a fourth growth rate at a peripheral portion around the sidewall adjacent to the gate structures.

8. The method according to claim 7, wherein the etchant used in forming the initial epitaxial layer comprises a third gas flow ratio greater than a fourth gas flow ratio used in growing the epitaxial silicon-rich layer.

9. The method according to claim 7, wherein forming an initial epitaxial layer comprises growing the initial epitaxial layer with a <100> plane around the central region of the initial epitaxial layer.

10. The method according to claim 7, wherein forming an initial epitaxial layer comprises growing the initial epitaxial layer with a faceted sidewall, wherein the faceted sidewall is in a plane different than a <100> plane and adjacent to the gate structures.

11. A method of manufacturing a semiconductor device, comprising:
    providing a substrate;
    forming gate structures over the substrate;

depositing a first semiconductive region of a first conductive type within the substrate, wherein a gap between the gate structures exposes a portion of the first semiconductive region; and forming a second semiconductive region of a second conductive type in the gap starting from the exposed portion of the first semiconductive region, comprising:

growing an epitaxial silicon-rich layer with a precursor and a first etchant having a first etching rate; and partially removing the epitaxial silicon-rich layer with a second etchant having a second etching rate greater than the first etching rate.

12. The method according to claim 11, further comprising forming a silicide layer on the second semiconductive region.

13. The method according to claim 12, wherein forming a silicide layer comprises depositing a metallic layer covering the second semiconductive region and performing a silicidation on the metallic layer and the second semiconductive region.

14. The method according to claim 11, wherein a first gas flow ratio of the etchant used in growing the epitaxial silicon-rich layer is less than a second gas flow ratio of the etchant used in partially removing the epitaxial silicon-rich layer.

15. The method according to claim 11, wherein forming a second semiconductive region in the gap starting from the exposed portion of the first semiconductive region comprises causing an entirety of a bottom portion of the second semiconductive region to contact the exposed portion of the first semiconductive region.

16. The method according to claim 11, wherein depositing a first semiconductive region of a first conductive type within the substrate comprises forming a recess in the substrate and forming the first semiconductive region in the recess.

17. The method according to claim 11, wherein growing an epitaxial silicon-rich layer comprises forming a peripheral portion covering at least a portion of the gate structure, wherein partially removing the epitaxial silicon-rich layer comprises removing the peripheral portion of the epitaxial silicon-rich layer from the gate structure.

18. A method of manufacturing a semiconductor device, comprising:

providing a substrate including a first semiconductive region of a first conductive type;

forming a second semiconductive region of a second conductive type different from the first conductive type over the first semiconductive region;

forming gate structures over the second semiconductive region, wherein a gap between the gate structures exposes a portion of the second semiconductive region; and forming a third semiconductive region of the first conductive type in the gap starting from the exposed portion of the second semiconductive region, comprising:

etching the second semiconductive region to form recesses between the gate structures;

epitaxially growing, in a chamber, an initial silicon-rich layer in each of the recesses with a cursor and an etchant, the cursor having a silicon growth rate greater than a silicon etching rate of the etchant, wherein a space is formed between one of the gate structures and a faceted sidewall of the initial silicon-rich layer; and performing, in the chamber, a cycle comprising:

growing an epitaxial layer on the initial silicon-rich layer with a first growth rate around a sidewall adjacent to the gate structures greater than a second growth rate at a central portion, wherein the grown epitaxial layer comprises at least one of amorphous silicon and polysilicon in the space; and thinning the epitaxial silicon-rich layer with an etchant with a first etching rate around the sidewall adjacent to the gate structures greater than a second etching rate at the central portion.

19. The method according to claim 18, wherein the etchant comprises at least one of HCl, $Cl_2$ and HF.

20. The method according to claim 18, wherein thinning the epitaxial silicon-rich layer is performed at a temperature between about 700° C. and about 900° C., and at a pressure between about 20 torr and about 40 torr.

* * * * *